United States Patent
Kim et al.

(10) Patent No.: US 12,069,899 B2
(45) Date of Patent: Aug. 20, 2024

(54) DISPLAY APPARATUS HAVING A BANK ON A PIXEL DEFINING LAYER

(71) Applicant: Samsung Display Co., Ltd., Yongin-si (KR)

(72) Inventors: Hyeongpil Kim, Yongin-si (KR); Byounghun Sung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 489 days.

(21) Appl. No.: 17/354,404

(22) Filed: Jun. 22, 2021

(65) Prior Publication Data

US 2022/0181410 A1 Jun. 9, 2022

(30) Foreign Application Priority Data

Dec. 8, 2020 (KR) ........................ 10-2020-0170748

(51) Int. Cl.
*H10K 59/122* (2023.01)
*H10K 50/13* (2023.01)
*H10K 59/38* (2023.01)

(52) U.S. Cl.
CPC ........... *H10K 59/122* (2023.02); *H10K 59/38* (2023.02); *H10K 50/13* (2023.02)

(58) Field of Classification Search
None
See application file for complete search history.

(56) References Cited

U.S. PATENT DOCUMENTS

| | | |
|---|---|---|
| 2009/0195146 A1 | 8/2009 | Hatwar et al. |
| 2010/0253209 A1 | 10/2010 | Spindler et al. |
| 2019/0221623 A1* | 7/2019 | Kamiyama ............ H10K 71/16 |
| 2019/0319075 A1* | 10/2019 | Lee ........................ H10K 50/86 |
| 2020/0212148 A1* | 7/2020 | Youn .................... H10K 71/135 |
| 2021/0013441 A1 | 1/2021 | Seo et al. |
| 2021/0405803 A1* | 12/2021 | Ye ......................... G06F 3/0446 |

FOREIGN PATENT DOCUMENTS

| | | |
|---|---|---|
| JP | 6636269 | 1/2020 |
| KR | 10-1676291 | 11/2016 |
| KR | 10-2020-0027136 | 3/2020 |

* cited by examiner

*Primary Examiner* — Nduka E Ojeh
(74) *Attorney, Agent, or Firm* — KILE PARK REED & HOUTTEMAN PLLC

(57) ABSTRACT

A display apparatus includes a lower substrate, a first pixel electrode, a second pixel electrode, and a third pixel electrode that are disposed apart from each other on the lower substrate, a pixel defining layer overlapping an edge of each of the first pixel electrode, the second pixel electrode, and the third pixel electrode, the pixel defining layer including a first opening exposing a center portion of the first pixel electrode, a second opening exposing a center portion of the second pixel electrode, and a third opening exposing a center portion of the third pixel electrode, and a bank disposed on the pixel defining layer and isolating the first opening from the second opening and the third opening.

19 Claims, 11 Drawing Sheets

DISPLAY APPARATUS HAVING A BANK ON A PIXEL DEFINING LAYER

CROSS-REFERENCE TO RELATED APPLICATION(S)

This application claims priority to and benefits of Korean Patent Application No. 10-2020-0170748 under 35 U.S.C. § 119, filed on Dec. 8, 2020 in the Korean Intellectual Property Office, the entire contents of which are incorporated herein by reference.

BACKGROUND

1. Technical Field

One or more embodiments relate to a display apparatus having a high light efficiency.

2. Description of the Related Art

A display apparatus may include many pixels. The pixels may emit light of different colors for implementation of a full-color display apparatus. To this end, at least some pixels of the display apparatus may have a color converting unit. Thus, light of a first color generated in a light-emitting portion of some pixels may be converted into light of a second color by passing through a color converting unit corresponding to the second color and may be output to the outside.

SUMMARY

The display apparatus according to the related art may have a low light efficiency.

One or more embodiments presented herein may include a display apparatus having a high light efficiency. However, this aspect is just an example, and the scope of the disclosure is not limited thereby.

Additional aspects will be set forth in part in the description which follows and, in part, will be apparent from the description, or may be learned by practice of the embodiments of the disclosure.

According to one or more embodiments, a display apparatus may include a lower substrate, a first pixel electrode, a second pixel electrode, and a third pixel electrode that are disposed apart from each other on the lower substrate, a pixel defining layer overlapping an edge of each of the first pixel electrode, the second pixel electrode, and the third pixel electrode, the pixel defining layer including a first opening exposing a center portion of the first pixel electrode, a second opening exposing a center portion of the second pixel electrode, and a third opening exposing a center portion of the third pixel electrode, and a bank disposed on the pixel defining layer and isolating the first opening from the second opening and the third opening.

The display apparatus may further include a first emission layer overlapping the first pixel electrode in view of a direction perpendicular to the lower substrate, the first emission layer emitting light of a wavelength belonging to a first wavelength band, a second emission layer overlapping the second pixel electrode and the third pixel electrode in view of the direction perpendicular to the lower substrate, the second emission layer being disposed apart from the first emission layer, and emitting light of a wavelength belonging to a second wavelength band, an upper substrate disposed on the lower substrate such that the first pixel electrode, the second pixel electrode, and the third pixel electrode may be disposed between the upper substrate and the lower substrate, and a first quantum dot layer disposed on a lower surface of the upper substrate toward the lower substrate, and overlapping the third pixel electrode in view of a direction perpendicular to the upper substrate, the first quantum dot layer converting light having a wavelength belonging to the second wavelength band, into light of a wavelength belonging to a third wavelength band.

The bank may have a first opening portion such that the first opening may be in the first opening portion in view of the direction perpendicular to the upper substrate.

An edge of the first opening portion may encircle the first opening in view of the direction perpendicular to the upper substrate.

The first emission layer may be disposed in the first opening portion.

The first emission layer may extend to an internal side surface of the first opening portion, and the second emission layer may extend to an external side surface of the bank.

The bank may have a second opening portion such that the second opening and the third opening may be in the second opening portion in view of the direction perpendicular to the upper substrate.

The second emission layer may be disposed in the second opening portion.

The second emission layer may extend to an internal side surface of the second opening portion, and the first emission layer may extend to an external side surface of the bank.

The bank may have a first opening portion such that the first opening may be in the first opening portion in view of the direction perpendicular to the upper substrate, and the bank may have a second opening portion such that the second opening and the third opening may be in the second opening portion in view of the direction perpendicular to the upper substrate.

The first emission layer may be in the first opening portion, and the second emission layer may be in the second opening portion.

The first emission layer may extend to an internal side surface of the first opening portion, and the second emission layer may extend to an internal side surface of the second opening portion.

The display apparatus may further include an additional emission layer overlapping the first pixel electrode, the second pixel electrode, and the third pixel electrode in view of the direction perpendicular to the upper substrate, the additional emission layer emitting light of a wavelength belonging to the first wavelength band, and a second quantum dot layer disposed on the lower surface of the upper substrate toward the lower substrate, and overlapping the second pixel electrode in view of the direction perpendicular to the upper substrate, the second quantum dot layer converting light having a wavelength belonging to the first wavelength band into light of a wavelength belonging to the second wavelength band, wherein the first quantum dot layer converts light having a wavelength belonging to the first wavelength band into light of a wavelength belonging to the third wavelength band.

The additional emission layer may be disposed between the first emission layer and the upper substrate and disposed between the second emission layer and the upper substrate.

The additional emission layer may include a first portion overlapping the first pixel electrode in view of the direction perpendicular to the upper substrate, and a second portion overlapping the second pixel electrode and the third pixel electrode, in view of the direction perpendicular to the upper substrate, and the first portion and the second portion may be apart from each other.

The display apparatus may further include a first auxiliary emission layer overlapping the first pixel electrode in view of the direction perpendicular to the lower substrate, the first auxiliary emission layer emitting light of a wavelength belonging to the first wavelength band, and a second auxiliary emission layer overlapping the second pixel electrode and the third pixel electrode in view of the direction perpendicular to the lower substrate, the second auxiliary emission layer being disposed apart from the first auxiliary emission layer, and emitting light of a wavelength belonging to the second wavelength band.

The display apparatus may further include an additional emission layer overlapping the first pixel electrode, the second pixel electrode, and the third pixel electrode in view of the direction perpendicular to the upper substrate, the additional emission layer emitting light of a wavelength belonging to the first wavelength band, and a second quantum dot layer disposed on the lower surface of the upper substrate toward the lower substrate, and overlapping the second pixel electrode in view of the direction perpendicular to the upper substrate, the second quantum dot layer converting light having a wavelength belonging to the first wavelength band, into light of a wavelength belonging to the second wavelength band, wherein the first quantum dot layer converts light having a wavelength belonging to the first wavelength band into light of a wavelength belonging to the third wavelength band.

The first auxiliary emission layer may be disposed between the first emission layer and the additional emission layer, and the second auxiliary emission layer may be disposed between the second emission layer and the additional emission layer.

The display apparatus may further include a first color filter layer disposed on the lower surface of the upper substrate and overlapping the first pixel electrode in view of the direction perpendicular to the upper substrate, the first color filter layer transmitting light of a wavelength belonging to the first wavelength band, a second color filter layer disposed on the lower surface of the upper substrate and overlapping the second pixel electrode in view of the direction perpendicular to the upper substrate, the second color filter layer transmitting light of a wavelength belonging to the second wavelength band, and a third color filter layer disposed between the upper substrate and the first quantum dot layer, the third color filter layer transmitting light of a wavelength belonging to the third wavelength band.

A wavelength of light emitted from the second emission layer may be greater than a wavelength of light emitted from the first emission layer.

Other aspects, features, and advantages other than those described above will become apparent from the accompanying drawings, the appended claims, and the detailed description of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
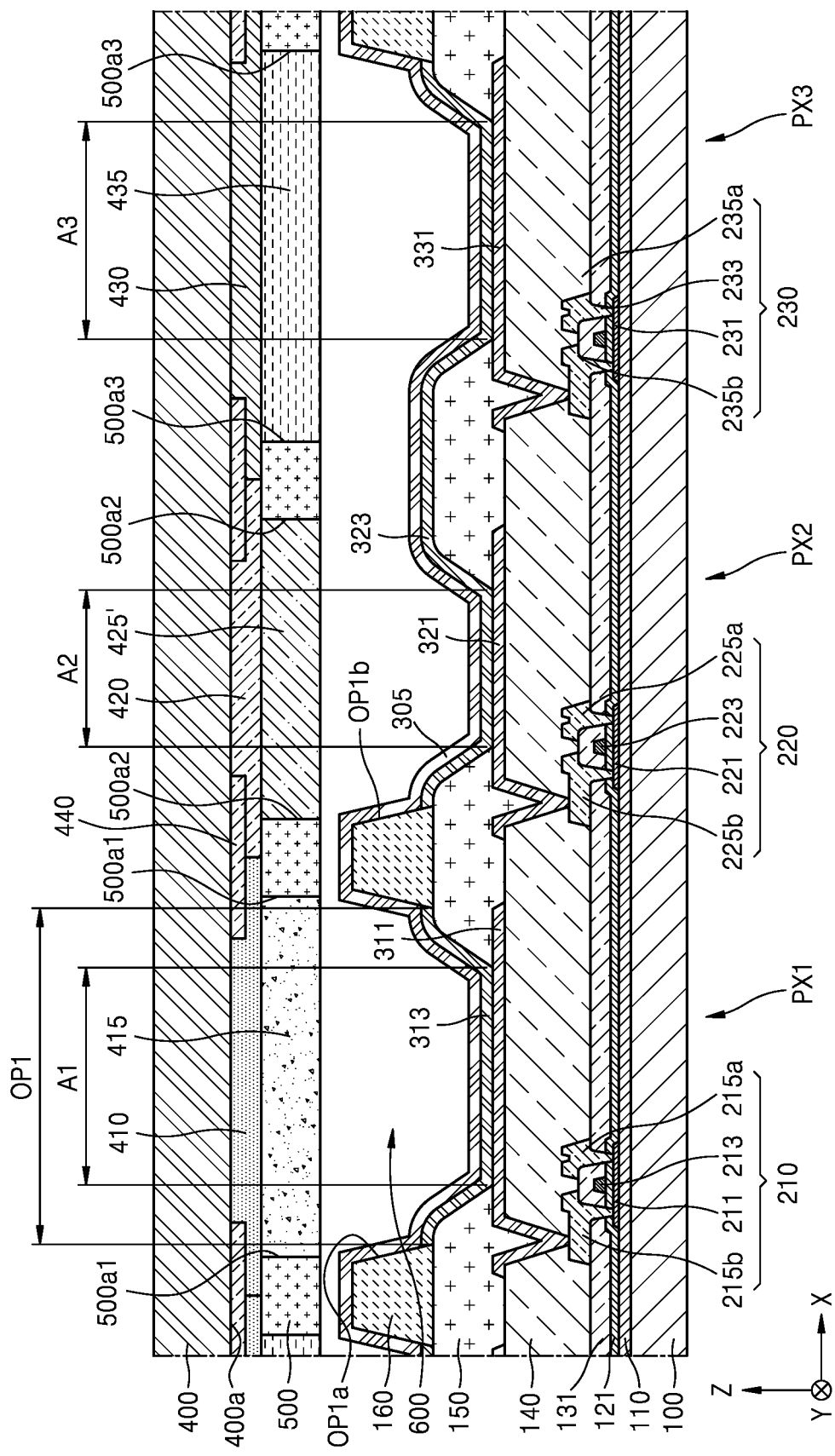
FIG. 1 is a cross-sectional view schematically illustrating a portion of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

As used herein, the singular forms, "a," "an," and "the" are intended to include the plural forms as well (and vice versa), unless the context clearly indicates otherwise.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

As used herein, the term "and/or" includes any and all combinations of one or more of the associated listed items. The terms "and" and "or" may be used in the conjunctive or disjunctive sense and may be understood to be equivalent to "and/or." Throughout the disclosure, the expression "at least one of a, b or c" indicates only a, only b, only c, both a and b, both a and c, both b and c, all of a, b, and c, or variations thereof.

Since the disclosure may have various modifications and several embodiments, only a limited number of embodiments are shown in the drawings and will be described in detail. The effects and features of the disclosure, and ways to achieve them will become apparent by referring to embodiments that will be described later in detail with reference to the drawings. However, the disclosure is not limited to the following embodiments but may be embodied in various forms.

Hereinafter, embodiments of the disclosure will be described in detail with reference to the accompanying drawings, and in the description with reference to the drawings, like reference numerals refer to like elements and redundant descriptions thereof will be omitted.

In the embodiments below, it will be understood when various elements such as a layer, a film, an area, or a plate are referred to as being "on" or "above" another element, they can be directly on or above the other element, or an intervening element may also be present. Also, in the drawings, for convenience of description, sizes of elements may be exaggerated or contracted. For example, since sizes and thicknesses of elements in the drawings may be arbitrarily illustrated for convenience of explanation, the following embodiments are not limited thereto.

In the embodiments below, an X-axis, a Y-axis, and a Z-axis are not limited to three axes on a rectangular coordinates system but may be construed as including these axes. For example, an X-axis, a Y-axis, and a Z-axis may be at right angles or may also indicate different directions from one another, which may not be at right angles.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
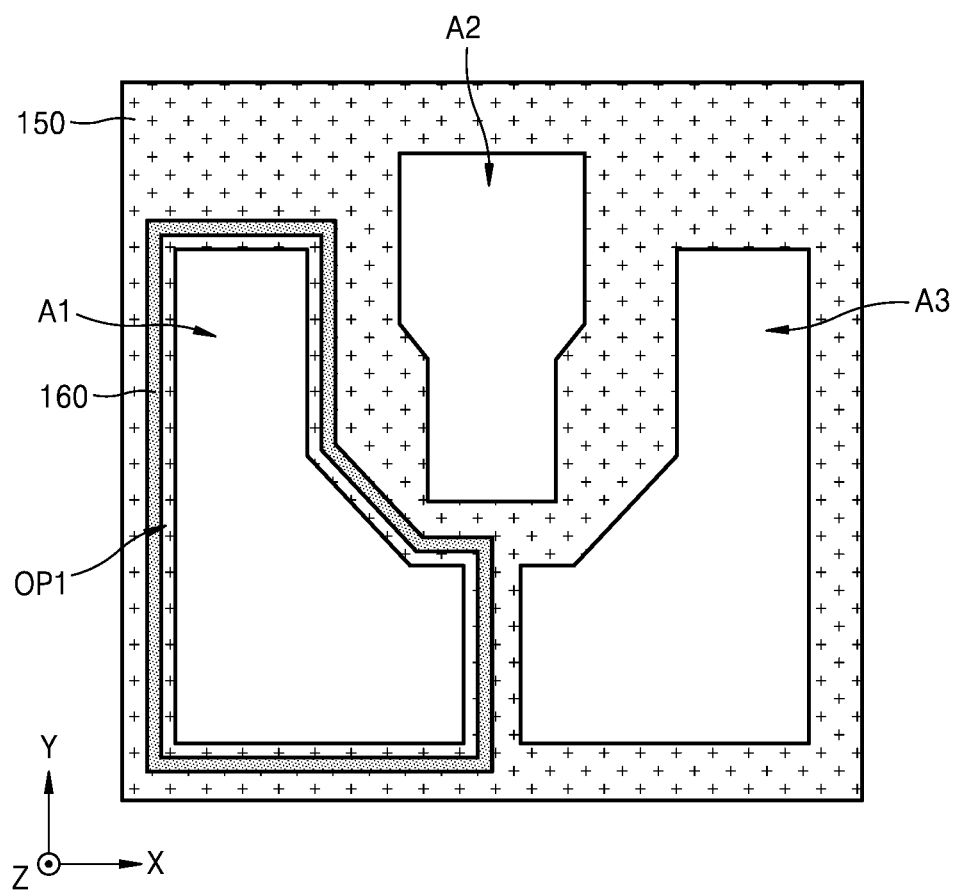
FIG. 2 is a plan view schematically illustrating a portion of the display apparatus of FIG. 1.

FIG. 1 is a cross-sectional view schematically illustrating a portion of a display apparatus according to an embodiment, and FIG. 2 is a plan view schematically illustrating a portion of the display apparatus of FIG. 1.

The display apparatus according to an embodiment may include a lower substrate 100, a first pixel electrode 311, a second pixel electrode 321, and a third pixel electrode 331 that may be disposed over the lower substrate 100, a pixel defining layer 150, and a bank 160.

The lower substrate 100 may include glass, a metal, a polymer resin, or a combination thereof. For example, the lower substrate 100 may include a polymer resin such as polyethersulfone, polyacrylate, polyetherimide, polyethylene naphthalate, polyethylene terephthalate, polyphenylene sulfide, polyarylate, polyimide, polycarbonate, cellulose acetate propionate, or a combination thereof. Various modifications may also be made to the lower substrate 100. For example, the lower substrate 100 may have a multi-layer structure including two layers each including the above-described polymer resin and a barrier layer that may be between the two layers and include an inorganic material (e.g., silicon oxide, silicon nitride, or silicon oxynitride).

The first pixel electrode 311, the second pixel electrode 321, and the third pixel electrode 331 may be disposed over the lower substrate 100. Also, other than the first pixel electrode 311, the second pixel electrode 321, and the third pixel electrode 331, a first thin-film transistor 210, a second thin-film transistor 220, and a third thin-film transistor 230 that may be respectively electrically connected to the first pixel electrode 311, the second pixel electrode 321, and the third pixel electrode 331 may be disposed on the lower substrate 100. For example, as illustrated in FIG. 1, the first pixel electrode 311 may be electrically connected to the first thin-film transistor 210, the second pixel electrode 321 may be electrically connected to the second thin-film transistor 220, and the third pixel electrode 331 may be electrically connected to the third thin-film transistor 230. The first pixel electrode 311, the second pixel electrode 321, and the third pixel electrode 331 may be disposed on a planarization layer 140 disposed over the lower substrate 100, which will be described later.

The first thin-film transistor 210 may include a first semiconductor layer 211 including an amorphous silicon, polycrystalline silicon, an organic semiconductor material, an oxide semiconductor material, or a combination thereof, a first gate electrode 213, a first source electrode 215a, and a first drain electrode 215b. The first gate electrode 213 may include various conductive materials and have various layered structures, and may include, for example, a Mo layer and an Al layer. The first gate electrode 213 may have a layered structure of Mo/Al/Mo. In other embodiments, the first gate electrode 213 may include a TiNx layer, an Al layer, and/or a Ti layer. The first source electrode 215a and the first drain electrode 215b may also include various conductive materials and have various layered structures, and may include, for example, a Ti layer, an Al layer, and/or a Cu layer. The first source electrode 215a and the first drain electrode 215b may have a layered structure of Ti/Al/Ti.

To ensure insulating characteristics between the first semiconductor layer 211 and the first gate electrode 213, a first gate insulating layer 121 including an inorganic material such as silicon oxide, silicon nitride, and/or silicon oxynitride or the like may be between the first semiconductor layer 211 and the first gate electrode 213. Moreover, an interlayer insulating layer 131 including an inorganic material such as silicon oxide, silicon nitride, and/or silicon oxynitride or the like may be disposed on the first gate electrode 213, and the first source electrode 215a and the first drain electrode 215b may be disposed on the interlayer insulating layer 131. An insulating layer including an inorganic material as described above may be formed using a chemical vapor deposition (CVD) method or an atomic layer deposition (ALD) method. This also applies to embodiments to be described later and modified examples thereof.

A buffer layer 110 including an inorganic material such as silicon oxide, silicon nitride, and/or silicon oxynitride or the like may be between the first thin-film transistor 210 and the lower substrate 100 having the above-described structure. The buffer layer 110 may increase the level of planarization of an upper surface of the lower substrate 100 or prevent or minimize penetration of impurities from the lower substrate 100 or the like into the first semiconductor layer 211 of the first thin-film transistor 210.

The second thin-film transistor 220 located in a second pixel PX2 may include a first semiconductor layer 221, a second gate electrode 223, a second source electrode 225a, and a second drain electrode 225b. The third thin-film transistor 230 located in a third pixel PX3 may include a third semiconductor layer 231, a third gate electrode 233, a third source electrode 235a, and a third drain electrode 235b. The second thin-film transistor 220 and the third thin-film transistor 230 may have a structure identical to or similar to that of the first thin-film transistor 210 located in a first pixel PX1, and thus description thereof will be omitted.

The planarization layer 140 may be disposed over the first thin-film transistor 210. For example, as illustrated in FIG. 1, in case that an organic light-emitting element including the first pixel electrode 311 is disposed over the first thin-film transistor 210, the planarization layer 140 may have a function of approximately planarizing an upper portion of a protection layer covering the first thin-film transistor 210. The planarization layer 140 may include an organic material such as acryl, a benzocyclobutene (BCB), hexamethyldisiloxane (HMDSO), or a combination thereof. While the planarization layer 140 is illustrated as a single layer in FIG. 1, various modifications may also be made. For example, the planarization layer 140 may have a multi-layer structure.

In the first pixel PX1, an organic light-emitting element may be disposed (e.g., located) including the first pixel electrode 311, an opposite electrode 305, and an intermediate layer that may be therebetween and include a first emission layer 313. As illustrated in FIG. 1, the first pixel electrode 311 may contact one of the first source electrode 215a and the first drain electrode 215b through an opening portion formed in the planarization layer 140 or the like, to be electrically connected to the first thin-film transistor 210. The first pixel electrode 311 may include a transmissive conductive layer formed of a transmissive conductive oxide such as ITO, $In_2O_3$, IZO, or a combination thereof, and a reflective layer formed of a metal such as Al or Ag. For example, the first pixel electrode 311 may have a three-layered structure of ITO/Ag/ITO.

The intermediate layer including the first emission layer 313 may have a shape patterned to correspond to the first pixel electrode 311. The intermediate layer may also include a hole injection layer, a hole transport layer, and/or an electron transport layer or the like, and the hole injection layer, the hole transport layer, and/or the electron transport layer or the like may be integrally formed as a single body over the first pixel electrode 311 through the third pixel electrode 331. The opposite electrode 305 on the intermediate layer may also be integrally formed as a single body over the first pixel electrode 311 through the third pixel electrode 331. The opposite electrode 305 may include a transmissive conductive layer formed of ITO, $In_2O_3$, IZO, or a combination thereof, and a semi-transmissive layer including a metal such as Al, Li, Mg, Yb, Ag, or a combination thereof. For example, the opposite electrode 305 may be a semi-transmissive layer including MgAg, AgYb, Yb/MgAg or Li/MgAg.

The pixel defining layer 150 may be disposed on the planarization layer 140. The pixel defining layer 150 may have openings respectively corresponding to respective pixels. For example, the pixel defining layer 150 may cover edges of each of the first pixel electrode 311, the second pixel electrode 321, and the third pixel electrode 331 and have a first opening A1 exposing a center portion of the first pixel electrode 311, a second opening A2 exposing a center portion of the second pixel electrode 321, and a third opening A3 exposing a center portion of the third pixel electrode 331. As described above, the pixel defining layer 150 may also have a function of defining pixels. Also, as illustrated in FIG. 1, the pixel defining layer 150 may prevent an arc or the like at the edges of the first pixel electrode 311, the second pixel electrode 321, and the third pixel electrode 331 by increasing a distance between the opposite electrode 305 and the edges of each of the first pixel electrode 311, the second pixel electrode 321, and the third pixel electrode 331. The pixel defining layer 150 may include an organic material such as polyimide or HMDSO.

The first emission layer 313 may overlap the first pixel electrode 311 in view of a direction perpendicular to the lower substrate 100 (Z-axis-direction) and emit light of a wavelength belonging to a first wavelength band. For example, the first emission layer 313 may be disposed over the first pixel electrode 311. The first wavelength band may be, for example, from about 450 nm to about 495 nm.

In the second pixel PX2, an organic light-emitting element may be located including the second pixel electrode 321, the opposite electrode 305, and an intermediate layer that may be therebetween and include a second emission layer 323. In the third pixel PX3, an organic light-emitting element may be located including the third pixel electrode 331, the opposite electrode 305, and an intermediate layer that may be therebetween and include the second emission layer 323. For example, the second emission layer 323 may overlap the second pixel electrode 321 and the third pixel electrode 331 in view of the direction perpendicular to the lower substrate 100 (Z-axis-direction). The second emission layer 323 may be apart from the first emission layer 313 and may emit light of a wavelength belonging to a second wavelength band. The second wavelength band may be, for example, from about 495 nm to about 570 nm.

The bank 160 may be disposed over the pixel defining layer 150. The bank 160 may isolate the first opening A1 of the pixel defining layer 150 from the second opening A2 and the third opening A3 of the pixel defining layer 150. For example, as described above, to physically separate the second emission layer 323 overlapping the second pixel electrode 321 and the third pixel electrode 331 in view of the direction perpendicular to the lower substrate 100 (Z-axis-direction), from the first emission layer 313 overlapping the first pixel electrode 311 in view of the direction perpendicular to the lower substrate 100 (Z-axis-direction). The bank 160 may include an organic material such as polyimide or HMDSO.

The organic light-emitting element as described above may be easily damaged by external moisture or oxygen, and thus may be covered using an encapsulation layer (not shown) according to necessity to be protected. The encapsulation layer may include a first inorganic encapsulation layer, an organic encapsulation layer, and a second inorganic encapsulation layer.

An upper substrate 400 may be disposed over the lower substrate 100 such that the first pixel electrode 311, the second pixel electrode 321, and the third pixel electrode 331, or the like may be between the upper substrate 400 and the lower substrate 100. The upper substrate 400 may include glass or a polymer resin. For example, the upper substrate 400 may include a polymer resin such as polyethersulfone, polyacrylate, polyetherimide, polyethylene naphthalate, polyethylene terephthalate, polyphenylene sulfide, polyarylate, polyimide, polycarbonate, cellulose acetate propionate, or a combination thereof. Various modifications may also be made to the upper substrate 400. For example, the upper substrate 400 may have a multi-layer structure including two layers each including the above-described polymer resin and a barrier layer that may be between the two layers and include an inorganic material (e.g., silicon oxide, silicon nitride, or silicon oxynitride). The upper substrate 400 may be flexible or bendable.

A dam 500 having first through third through holes 500a1, 500a2, and 500a3 may be disposed on a lower surface 400a of the upper substrate 400 in a direction to the lower substrate 100 (Z direction). The dam 500 may have the first through hole 500a1 corresponding to the first opening A1 of the pixel defining layer 150, the second through hole 500a2 corresponding to the second opening A2 of the pixel defining layer 150, and the third through hole 500a3 corresponding to the third opening A3 of the pixel defining layer 150. For example, in view of a direction perpendicular to the lower surface 400a of the upper substrate 400 (Z-axis-direction), the first through hole 500a1 through the third through hole 500a3 of the dam 500 may respectively overlap the first opening A1 through the third opening A3 of the pixel defining layer 150. In detail, in view of the direction perpendicular to the lower surface 400a of the upper substrate 400 (Z-axis-direction), a shape of an edge of each of the first through hole 500a1 through the third through hole 500a3 of the dam 500 may be identical or similar to that of an edge of a corresponding opening among the first through hole 500a1 through the third through hole 500a3.

The dam 500 may include various materials, for example, an inorganic material such as silicon oxide, silicon nitride, and/or silicon oxynitride or the like. The dam 500 may include a photoresist material as necessary, and thus the dam 500 may be easily formed by processes such as exposure and development or the like.

A first quantum dot layer 435 may be disposed over the lower surface 400a of the upper substrate 400 toward the lower substrate 100 (−z direction), and the first quantum dot layer 435 may overlap the third pixel electrode 331 in view of a direction perpendicular to the upper substrate 400 (Z-axis-direction) and may be used to convert light passing through the first quantum dot layer 435 and having a wavelength belonging to the second wavelength band, into light of a wavelength belonging to a third wavelength band. The third wavelength band may be, for example, from about 630 nm to about 780 nm.

The first quantum dot layer 435 may have a form in which quantum dots may be dispersed in a resin. In an embodiment, embodiments to be described below, and modified examples thereof, quantum dots refer to crystals of a semiconductor compound, and may include an arbitrary material capable of emitting light of various light-emitting wavelengths. A diameter of the quantum dots may be, for example, about 1 nm to about 10 nm.

Quantum dots may be synthesized by a wet chemical process, an organic metal chemical deposition process, a molecular beam epitaxy process, or other similar processes thereto. The wet chemical process may be a method of mixing an organic solvent with a precursor material and growing quantum dot particle crystals. In the wet chemical process, an organic solvent may naturally act as a dispersant coordinated on surfaces of quantum dot crystals in case that the crystals are grown and control the growth of the crystals. Thus, this method may be easier than a metal organic chemical vapor deposition (MOCVD) method or a vapor deposition method such as a molecular beam epitaxy (MBE). The wet chemical process may be a low-cost process that allows controlled growth of quantum dot particles.

The quantum dots may include a Group III-VI semiconductor compound, a Group II-VI semiconductor compound, a Group III-V semiconductor compound, a Group II-III-VI semiconductor compound, a Group I-III-VI semiconductor compound, a Group IV-VI semiconductor compound, a Group IV element or compound, or a combination thereof.

Examples of a Group III-VI semiconductor compound may include a binary compound such as GaS, GaSe, $Ga_2Se_3$, GaTe, InS, $In_2S_3$, InSe, $In_2Se_3$, or InTe or a ternary compound such as $InGsS_3$, $InGaSe_3$, AgInS, $AgInS_2$, CuInS or $CuInS_2$, or a combination thereof.

Examples of a Group II-VI semiconductor compound may include a binary compound such as CdS, CdSe, CdTe, ZnS, ZnSe, ZnTe, ZnO, HgS, HgSe, HgTe, MgSe or MgS, a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe or MgZnS, a quaternary compound such as CdZnSeS, CdZnSeTe, CdZnSTe, CdHgSeS, CdHgSeTe, CdHgSTe, HgZnSeS, HgZnSeTe or HgZnSTe, or a combination thereof.

Examples of a Group III-V semiconductor compound may include a binary compound such as GaN, GaP, GaAs, GaSb, AlN, AlP, AlAs, AlSb, InN, InP, InAs or InSb, a ternary compound such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb or GaAlNP, a quaternary compound such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs or InAlPSb, or a combination thereof. Group III-V semiconductor compounds may further include a Group II-element. Examples of a Group III-V semiconductor compound further including a Group II element may include InZnP, InGaZnP or InAlZnP.

Examples of a Group I-III-VI semiconductor compound may include a ternary compound such as AgInS, $AgInS_2$, CuInS, $CuInS_2$, $CuGaO_2$, $AgGaO_2$ or $AgAlO_2$, or a combination thereof.

Examples of a Group IV-VI semiconductor compound may include a binary compound such as SnS, SnSe, SnTe, PbS, PbSe or PbTe, a ternary compound such as SnSeS, SnSeTe, SnSTe, PbSeS, PbSeTe, PbSTe, SnPbS, SnPbSe or SnPbTe, a quaternary compound such as SnPbSSe, SnPbSeTe or SnPbSTe, or a combination thereof.

Group IV elements or compounds may include a single-element compound such as Si or Ge, a binary compound such as SiC or SiGe, or a combination thereof.

Elements included in a multi-element compound such as a binary compound, a ternary compound, and a quaternary compound may be in particles at a uniform concentration or non-uniform concentration.

Quantum dots may have a single structure in which a concentration of each element included in the quantum dots may be uniform or a core-shell double structure. For example, a material included in a core may be different from that included in a shell. A shell of quantum dots may act as a protection layer to prevent chemical degeneration of a core to maintain semiconductor characteristics and/or as a charging layer to impart electrophoretic characteristics to quantum dots. The shell may be a single layer or a multi-layer. An interface between a core and a shell may have a concentration gradient in which a concentration of an element in the shell decreases toward a center thereof.

Examples of a shell of quantum dots may include an oxide of a metal or a non-metal, a semiconductor compound, or a combination thereof. Examples of an oxide of a metal or a non-metal may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ or NiO, a ternary compound such as $MgAl_2O_4$, $CoFe_2O_4$, $NiFe_2O_4$ or $CoMn_2O_4$, or a combination thereof. Examples of a semiconductor compound may include a Group III-VI semiconductor compound, a Group II-VI semiconductor compound, a Group III-V semiconductor compound, a Group II-III-VI semiconductor compound, a Group I-III-VI semiconductor compound, a Group IV-VI semiconductor compound, or a combination thereof. For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or a combination thereof.

Quantum dots may have a full width of half maximum (FWHM) of an emission wavelength spectrum of about 45 nm or less, specifically about 40 nm or less, more specifically about 30 nm or less, and color purity or color representation may be improved in the above ranges. Light emitted through the above quantum dots may be emitted omnidirectionally, thus improving a viewing angle of light.

The quantum dot may be in the form of nano-particles, nanotubes, nanowires, nanofiber, or nano planar particles and have a spherical shape, a pyramid shape, a multi-arm shape, or a cubic shape.

An energy band gap may be controlled by controlling a size of the quantum dots, and thus, light of various wavelength bands may be obtained from a quantum dot emission layer. Accordingly, by using quantum dots of different sizes, a light-emitting element emitting light of various wavelengths may be implemented. In detail, a size of quantum dots may be selected such that light of a red color, a green color, and/or a blue color may be emitted. A size of quantum dots may be configured such that white light may be emitted as light of various colors may be combined.

The first quantum dot layer 435 may include a scatterer. By allowing incident light to scatter via the scatterer included in the first quantum dot layer 435, the incident light may be efficiently converted using the quantum dots in the first quantum dot layer 435. Any material that may be capable of partially scattering transmitted light by forming an optical interface between a scatterer and a transmissive resin may be used as the scatterer. For example, the scatterer may be a metal oxide particle or an organic particle. Examples of a metal oxide to be used as a scatterer may include a titanium oxide ($TiO_2$), a zirconium oxide ($ZrO_2$), an aluminum oxide ($Al_2O_3$), an indium oxide ($In_2O_3$), a zinc oxide (ZnO), or a tin oxide ($SnO_2$), and examples of an organic material to be used as a scatterer may include an acrylic resin or a urethane-based resin. A scatterer may scatter light in various directions regardless of an angle of incidence of the light without substantially converting a wavelength of incident light. Accordingly, the scatterer may improve lateral viewability of a display apparatus. A scatterer included in the first quantum dot layer 435 may increase a probability that incident light incident on the first quantum dot layer 435 meets quantum dots, thereby increasing a light conversion efficiency.

Any material that has excellent dispersion characteristics with respect to a scatterer and may be transmissive may be used as a resin to be included in the first quantum dot layer 435. For example, a polymer resin such as an acrylic resin, an imide-based resin, an epoxy resin, BCB, or HMDSO may be used as a material for forming the first quantum dot layer 435. The material for forming the first quantum dot layer 435 may be located in the third through hole 500a3 of the dam 500 overlapping the third pixel electrode 331 by using an inkjet printing method.

According to the display apparatus of an embodiment as described above, light of a wavelength belonging to the first wavelength band may be emitted from the first emission layer 313 in the first pixel PX1, light of a wavelength belonging to the second wavelength band may be emitted from the second emission layer 323 in the second pixel PX2, and in the third pixel PX3, the light of the wavelength that corresponds to the second wavelength band and may be emitted from the second emission layer 323, may be converted into light of a wavelength belonging to the third wavelength band in the first quantum dot layer 435. Accordingly, the display apparatus according to an embodiment may display a full-color image.

In the third pixel PX3, the light of a wavelength belonging to the second wavelength band may be converted into light of a wavelength belonging to the third wavelength band in the first quantum dot layer 435. Unlike the above, in the first pixel PX1, light of a wavelength belonging to the first wavelength band, generated in the first emission layer 313, may be emitted to the outside via the upper substrate 400, without wavelength conversion. Thus, the first pixel PX1 may have no quantum dot layer. Accordingly, a first transmissive layer 415 including a transmissive resin may be located in the first through hole 500a1 of the dam 500 overlapping the first pixel electrode 311. The first transmissive layer 415 may include acryl, BCB, or HMDSO. Moreover, the first transmissive layer 415 may also include a scatterer. Also, unlike the illustration of FIG. 1, the first transmissive layer 415 may not be included in the first through hole 500a1 of the dam 500.

In the second pixel PX2, also, light of a wavelength belonging to the second wavelength band, generated in the second emission layer 323, may be emitted to the outside via the upper substrate 400, without wavelength conversion. Thus, the second pixel PX2 may have no quantum dot layer. Accordingly, a second transmissive layer 425' including a transmissive resin may be located in the second through hole 500a2 of the dam 500 overlapping the second pixel electrode 321. The second transmissive layer 425' may include acryl, BCB, or HMDSO. Moreover, the second transmissive layer 425' may also include a scatterer. Also, unlike the illustration of FIG. 1, the second transmissive layer 425' may not be included in the second through hole 500a2 of the dam 500.

As illustrated in FIG. 1, a color filter layer may be between the lower surface 400a of the upper substrate 400 toward the lower substrate 100 (−z direction) and the first transmissive layer 415, the second transmissive layer 425', and the first quantum dot layer 435. For example, a first color filter layer 410 may be between the upper substrate 400 and the first transmissive layer 415, a second color filter layer 420 may be between the upper substrate 400 and the second transmissive layer 425', and a third color filter layer 430 may be between the upper substrate 400 and the first quantum dot layer 435. The first color filter layer 410 may be a layer that transmits only light of a wavelength belonging to about 450 nm to about 495 nm. The second color filter layer 420 may be a layer that transmits only light of a wavelength belonging to about 495 nm to about 570 nm. The third color filter layer 430 may be a layer that transmits only light of a wavelength belonging to about 630 nm to about 780 nm.

The first color filter layer 410 through the third color filter layer 430 may increase color purity of light emitted to the outside, thereby increasing a quality of a displayed image. Also, the first color filter layer 410 through the third color filter layer 430 may reduce a ratio of external light that may be incident from the outside to the display apparatus and reflected by the first pixel electrode 311 through the third pixel electrode 331 to be emitted to the outside again, thereby reducing external light reflection. A black matrix 440 may be between the first color filter layer 410 through the third color filter layer 430.

A filler 600 may be filled between the upper substrate 400 and the lower substrate 100. For example, in the display apparatus as illustrated in FIG. 1, the filler 600 may be filled between the opposite electrode 305 and the first transmissive layer 415, the second transmissive layer 425', and the first quantum dot layer 435. The filler 600 may include a transmissive material. For example, the filler 600 may include an acrylic resin or an epoxy resin.

According to the display apparatus of an embodiment, as described above, light of a wavelength belonging to the first wavelength band may be emitted from the first emission layer 313 in the first pixel PX1, light of a wavelength belonging to the second wavelength band may be emitted from the second emission layer 323 in the second pixel PX2, and in the third pixel PX3, the light of a wavelength that corresponds to the second wavelength band and may be emitted from the second emission layer 323 may be converted into light of a wavelength belonging to the third wavelength band in the first quantum dot layer 435. Accordingly, the display apparatus according to an embodiment may display a full-color image.

It may be also considered to locate an emission layer emitting light of a wavelength belonging to the first wavelength band, in each of the first pixel PX1 through third pixel PX3, and allow light of a wavelength belonging to the first wavelength band to be emitted from the first pixel PX1 without any change, and convert light of a wavelength belonging to the first wavelength band into light of a wavelength belonging to the second wavelength and emit the light obtained by the conversion from the second pixel, and convert light of a wavelength belonging to the first wavelength band into light of a wavelength belonging to the third wavelength and emit the light obtained by the conversion from the third pixel. However, an efficiency of converting light of a wavelength belonging to the first wavelength band into light of a wavelength belonging to the second wavelength band may be different from an efficiency of converting light of a wavelength belonging to the first wavelength band into light of a wavelength belonging to the third wavelength band, and when any one of the efficiencies may be low, the entire quality of the display apparatus may be inevitably degraded. For example, when an efficiency of converting light of a wavelength belonging to about 450 nm to about 495 nm, which may be the first wavelength band, into light of a wavelength belonging to about 495 nm to about 570 nm, which may be the second wavelength band, may be relatively low, the entire quality of the display apparatus may be inevitably degraded.

However, according to the display apparatus of an embodiment, the first pixel PX1 includes the first emission layer 313 emitting light of a wavelength belonging to the first wavelength band, and the second pixel PX2 and the third pixel PX3 include the second emission layer 323 emitting light of a wavelength belonging to the second wavelength band, and thus, a low light-converting efficiency in the second pixel PX2 may be fundamentally prevented.

For reference, as the first quantum dot layer 435 converts light of a wavelength belonging to about 495 nm to about 570 nm, which may be the second wavelength band, into light of a wavelength belonging to about 630 nm to about 780 nm, which may be the third wavelength band, an efficiency of converting light of a wavelength belonging to about 495 nm to about 570 nm, which may be the second wavelength band, into light of a wavelength belonging to about 630 nm to about 780 nm, which may be the third wavelength band, or an efficiency of converting light of a wavelength belonging to about 450 nm to about 495 nm, which may be the first wavelength band, into light of a wavelength belonging to about 630 nm to about 780 nm, which may be the third wavelength band, may be higher than an efficiency of converting light of a wavelength belonging to about 450 nm to about 495 nm, which may be the first wavelength band, into light of a wavelength belonging to about 495 nm to about 570 nm, which may be the second wavelength band. Accordingly, in the display apparatus according to an embodiment, which includes the first quantum dot layer 435, degradation of a light converting efficiency may be prevented.

As the second emission layer 323 may be disposed over the second pixel electrode 321 and the third pixel electrode 331, the second emission layer 323 may be integrally formed as a single body over the second pixel electrode 321 and the third pixel electrode 331. To easily form the second emission layer 323, which may be integrally formed, a height of the pixel defining layer 150 may be controlled not to be excessively large. However, as the first emission layer 313 may be disposed over the first pixel electrode 311 and the second emission layer 323 different from the first emission layer 313 may be disposed over the second pixel electrode 321 and the third pixel electrode 331, there may be a need to prevent mixture of a material for forming the first emission layer 313 with a material for forming the second emission layer 323 in a manufacturing process.

To this end, the display apparatus according to an embodiment may include the bank 160 disposed on the pixel defining layer 150. The bank 160 may isolate the first opening A1 of the pixel defining layer 150 in the first pixel PX1 from the second opening A2 and the third opening A3 of the pixel defining layer 150 in the second pixel PX2 and the third pixel PX3. Accordingly, mixture of the material for forming the first emission layer 313 with the material for forming the second emission layer 323 may be prevented in a manufacturing process.

For example, as illustrated in FIG. 2, the bank 160 may include a first opening portion OP1 such that, in view of a direction perpendicular to the upper substrate 400 (Z-axis-direction), the first opening A1 of the pixel defining layer 150 may be located in the first opening portion OP1. An edge of the first opening portion OP1 may completely encircle the first opening A1 in view of the direction perpendicular to the upper substrate 400 (Z-axis-direction). For example, in view of the direction perpendicular to the upper substrate 400 (Z-axis-direction), an internal side surface of the first opening portion OP1 may form a closed curve around the first opening A1.

The first emission layer 313 may be located in the first opening portion OP1 of the bank 160. Accordingly, the first emission layer 313 may extend to an internal side surface OP1a of the first opening portion OP1 of the bank 160 to contact the internal side surface OP1a of the first opening portion OP1 of the bank 160, and the second emission layer 323 may extend to an external lateral OP1b of the bank 160 to contact the external lateral OP1b of the bank 160.

Figure 3:
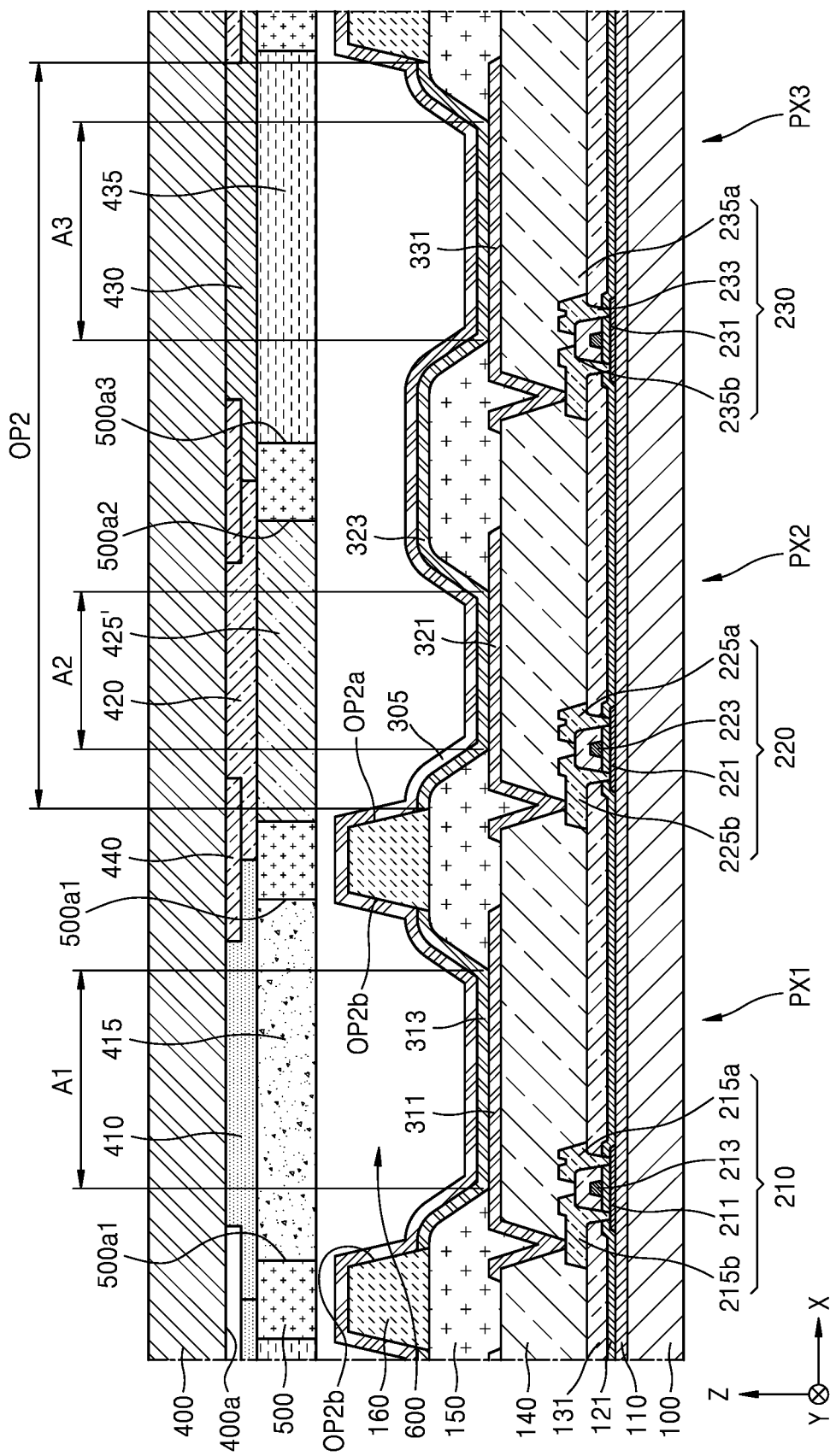
FIG. 3 is a cross-sectional view schematically illustrating a portion of a display apparatus according to another embodiment.

However, the bank 160 may be just to perform a function of isolating the first opening A1 of the pixel defining layer 150 from the second opening A2 and the third opening A3 of the pixel defining layer 150, and thus, the disclosure is not limited to the illustration of FIGS. 1 and 2. For example, as illustrated in FIG. 3 which is a schematic cross-sectional view of a portion of a display apparatus according to another embodiment and FIG. 4 which is a schematic plan view of the portion of the display apparatus of FIG. 3, the bank 160 may include a second opening portion OP2, and in view of the direction perpendicular to the upper substrate 400 (Z-axis-direction), the second opening A2 and the third opening A3 of the pixel defining layer 150 may be located in the second opening portion OP2 of the bank 160.

In view of a direction perpendicular to the upper substrate 400 (Z-axis-direction), the second emission layer 323 on the second pixel electrode 321 and the third pixel electrode 331 may be located in the second opening portion OP2 of the bank 160. The second emission layer 323 may extend to an internal side surface OP2a of the second opening portion OP2 of the bank 160 to contact the internal side surface OP2a of the second opening portion OP2 of the bank 160, and the first emission layer 313 on the first pixel electrode 311 may extend to an external side surface OP2b of the bank 160 to contact the external side surface OP2b of the bank 160.

Figure 5:
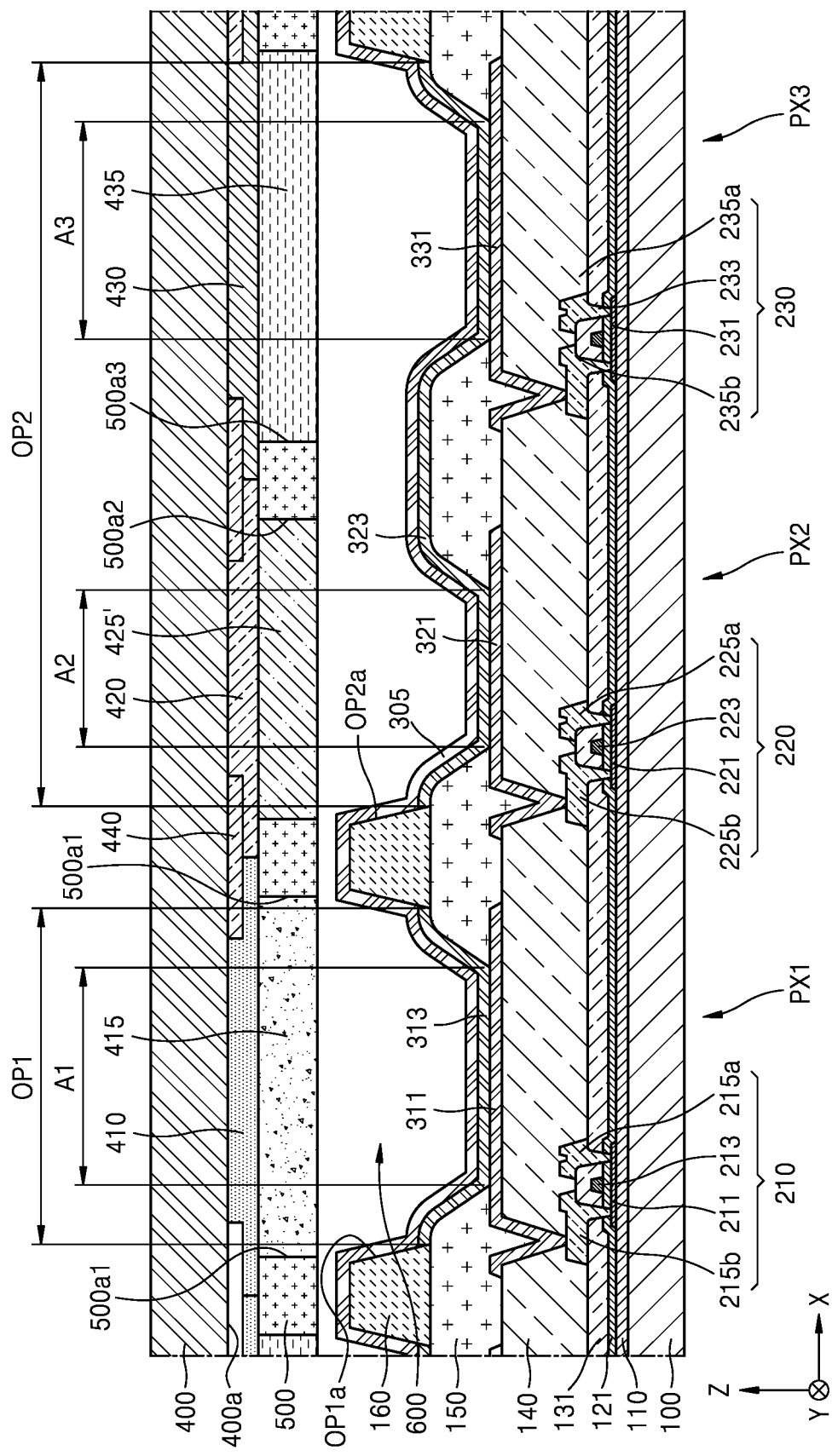
FIG. 5 is a cross-sectional view schematically illustrating a portion of a display apparatus according to another embodiment.
Figure 6:
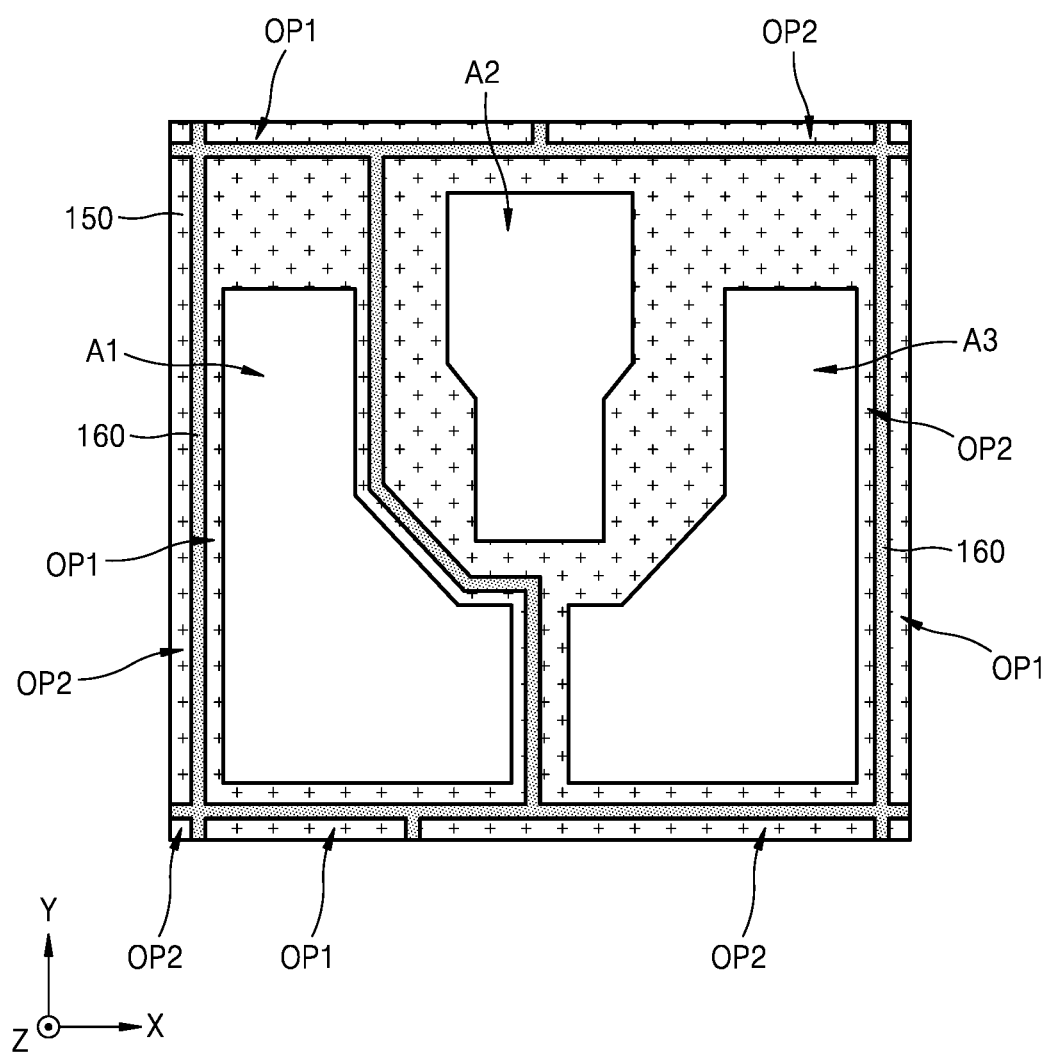
FIG. 6 is a plan view schematically illustrating a portion of the display apparatus of FIG. 5.

The disclosure is not limited thereto, and as illustrated in FIG. 5 which is a schematic cross-sectional view of a portion of a display apparatus according to another embodiment and FIG. 6 which is a schematic plan view of the portion of the display apparatus of FIG. 5, the bank 160 may include both the first opening portion OP1 and the second opening portion OP2. In view of a direction perpendicular to the upper substrate 400 (Z-axis-direction), the first opening A1 of the pixel defining layer 150 may be located in the first opening portion OP1 of the bank 160, and the second opening A2 and the third opening A3 of the pixel defining layer 150 may be located in the second opening portion OP2 of the bank 160. Accordingly, the first emission layer 313 on the first pixel electrode 311 may be located in the first opening portion OP1 of the bank 160, and the second emission layer 323 on the second pixel electrode 321 and the third pixel electrode 331 may be located in the second opening portion OP2 of the bank 160. The first emission layer 313 may extend to the internal side surface OP1a of the first opening portion OP1 of the bank 160 to contact the internal side surface OP1a of the first opening portion OP1 of the bank 160, and the second emission layer 323 may extend to the internal side surface OP2a of the second opening portion OP2 of the bank 160 to contact the internal side surface OP2a of the second opening portion OP2 of the bank 160.

Figure 7:
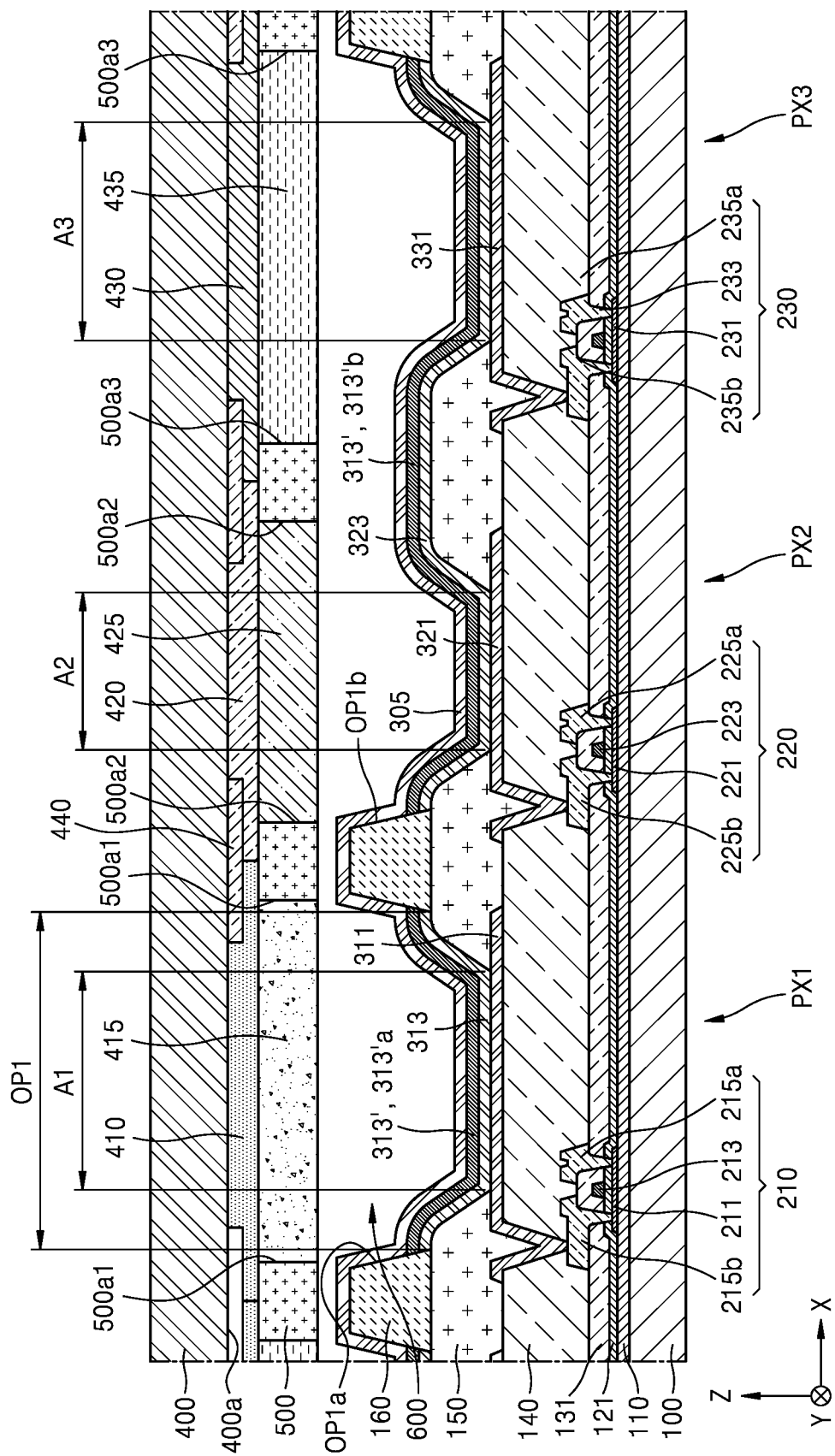
FIG. 7 is a cross-sectional view schematically illustrating a portion of a display apparatus according to another embodiment.

FIG. 7 is a cross-sectional view schematically illustrating a portion of a display apparatus according to another embodiment. The display apparatus according to an embodiment may be different from the display apparatus of an embodiment described with reference to FIGS. 1 and 2 in that the display apparatus may further include an additional emission layer 313' and a second quantum dot layer 425, instead of the transmissive layer 425' (see FIG. 1), may be included in the second pixel PX2.

The second quantum dot layer 425 may be disposed on the lower surface 400a of the upper substrate 400 toward the lower substrate 100 (Z direction), and the second quantum dot layer 425 may overlap the second pixel electrode 321 in view of the direction perpendicular to the upper substrate 400 (Z-axis-direction) and may convert light passing through the second quantum dot layer 425 and having a wavelength belonging to the first wavelength band into light of a wavelength belonging to the second wavelength band.

The second quantum dot layer 425 may have a form in which quantum dots may be dispersed in a resin. Quantum dots may include a semiconductor material such as cadmium sulfide (CdS), cadmium telluride (CdTe), zinc sulfide (ZnS), and/or indium phosphide (InP). Any transmissive material may be used as a resin to be included in the second quantum dot layer 425. For example, a polymer resin such as BCB or HMDSO may be used as a material for forming the second quantum dot layer 425. The material for forming the second quantum dot layer 425 may be located in the second through hole 500a2 of the dam 500 overlapping the second pixel electrode 321 by using an inkjet printing method.

The additional emission layer 313' may overlap the first pixel electrode 311, the second pixel electrode 321, and the third pixel electrode 331 in view of the direction perpendicular to the upper substrate 400 (Z-axis-direction). Also, like the first emission layer 313, the additional emission layer 313' may emit light of a wavelength belonging to the first wavelength band, which may be from about 450 nm to about 495 nm.

In the first pixel PX1 in which the first pixel electrode 311 may be located, light of a wavelength that corresponds to the first wavelength band and may be emitted from the first emission layer 313 and the additional emission layer 313' may be emitted to the outside. In the third pixel PX3 in which the third pixel electrode 331 may be located, the first quantum dot layer 435 may convert light of a wavelength that corresponds to the second wavelength band and may be emitted from the second emission layer 323, and light of a wavelength that corresponds to the first wavelength band and may be emitted from the additional emission layer 313', into light of a wavelength belonging to the third wavelength band, thereby emitting light of the wavelength belonging to the third wavelength band to the outside. In the second pixel PX2 in which the second pixel electrode 321 may be located, light of a wavelength that corresponds to the second wavelength band and may be emitted from the second emission layer 323, may be emitted to the outside without any change, and light of a wavelength that corresponds to the first wavelength band and may be emitted from the additional emission layer 313' may be converted by the second quantum dot layer 425 into light of a wavelength belonging to the second wavelength band and emitted to the outside.

As described above, an efficiency of converting light of a wavelength belonging to about 450 nm to about 495 nm, which may be the first wavelength band, into light of a wavelength belonging to about 495 nm to about 570 nm, which may be the second wavelength band, may be relatively low. However, according to the display apparatus of an embodiment, light of a wavelength belonging to the first wavelength band may be converted into light of a wavelength belonging to the second wavelength band and emitted to the outside from the second pixel PX2, but also, light of a wavelength belonging to the second wavelength band may also be generated and emitted from the second pixel PX2, and thus, the problem of a low wavelength conversion efficiency in the second pixel PX2 may be effectively addressed.

For reference, the first quantum dot layer 435 may convert light of a wavelength belonging to about 495 nm to about 570 nm, which may be the second wavelength band, into light of a wavelength belonging to about 630 nm to about 780 nm, which may be the third wavelength band, and thus, the light of a wavelength belonging to about 495 nm to about 570 nm, which may be the first wavelength band, may also be converted into light of a wavelength belonging to about 630 nm to about 780 nm, which may be the third wavelength band. This may be because, as light of a wavelength belonging to the first wavelength band has a higher energy than that of light of a wavelength belonging to the second wavelength band, the first quantum dot layer 435 which may be capable of absorbing the energy of the light of a wavelength belonging to the second wavelength band may absorb higher energy than the above energy, and after absorbing all light energy, the first quantum dot layer 435 may emit light of a wavelength belonging to about 630 nm to about 780 nm, which may be the third wavelength band.

The additional emission layer 313' may be between the first emission layer 313 and the second emission layer 323 and the upper substrate 400 as illustrated in FIG. 7. As described above, the bank 160 may prevent mixture of a material for forming the first emission layer 313 with a material for forming the second emission layer 323 in a manufacturing process. In detail, the material for forming the second emission layer 323 may be prevented from being located in the first pixel PX1. Thus, by forming the first emission layer 313 and the second emission layer 323 before the additional emission layer 313' in the manufacturing process, the material for forming the second emission layer 323 may be effectively prevented from reaching the first pixel PX1 or only a very limited portion of the material for forming the second emission layer 323 may reach the first pixel PX1. When the additional emission layer 313' may be first formed and the first emission layer 313 and the second emission layer 323 may be formed, a distance between a surface on which the second emission layer 323 is to be formed and an end of the bank 160 toward the upper substrate 400 may be reduced, thus increasing a probability that the material for forming the second emission layer 323 may be located in the first pixel PX1.

As illustrated in FIG. 7, the additional emission layer 313' may include a first portion 313'a overlapping the first pixel electrode 311 and a second portion 313'b overlapping the second pixel electrode 321 and the third pixel electrode 331, in view of the direction perpendicular to the upper substrate 400 (Z-axis-direction), and the first portion 313'a and the second portion 313'b may be apart from each other.

For reference, a charge forming layer (not shown) may be between the first emission layer 313 and the additional emission layer 313'. As the first emission layer 313 and the additional emission layer 313' may be located in the first pixel PX1, two emission layers may be located in the first pixel PX1 as a result. Thus, light may be emitted from each of the first emission layer 313 and the additional emission layer 313' when electrons and holes may be properly supplied to each of the first emission layer 313 and the additional emission layer 313'. Holes may be supplied from the first pixel electrode 311 to the first emission layer 313, but electrons from the opposite electrode 305 may not be easily supplied to the first emission layer 313. Also, while electrons may be supplied from the opposite electrode 305 to the additional emission layer 313', holes from the first pixel electrode 311 may not be easily supplied to the additional emission layer 313'.

To prevent this, a charge forming layer may be between the first emission layer 313 and the additional emission layer 313'. The charge forming layer may include, for example, an electron forming layer adjacent to the first emission layer 313 and a hole forming layer adjacent to the additional emission layer 313'. The electron forming layer may be used to supply electrons to the first emission layer 313, and the hole forming layer may be used to supply holes to the additional emission layer 313'.

Figure 8:
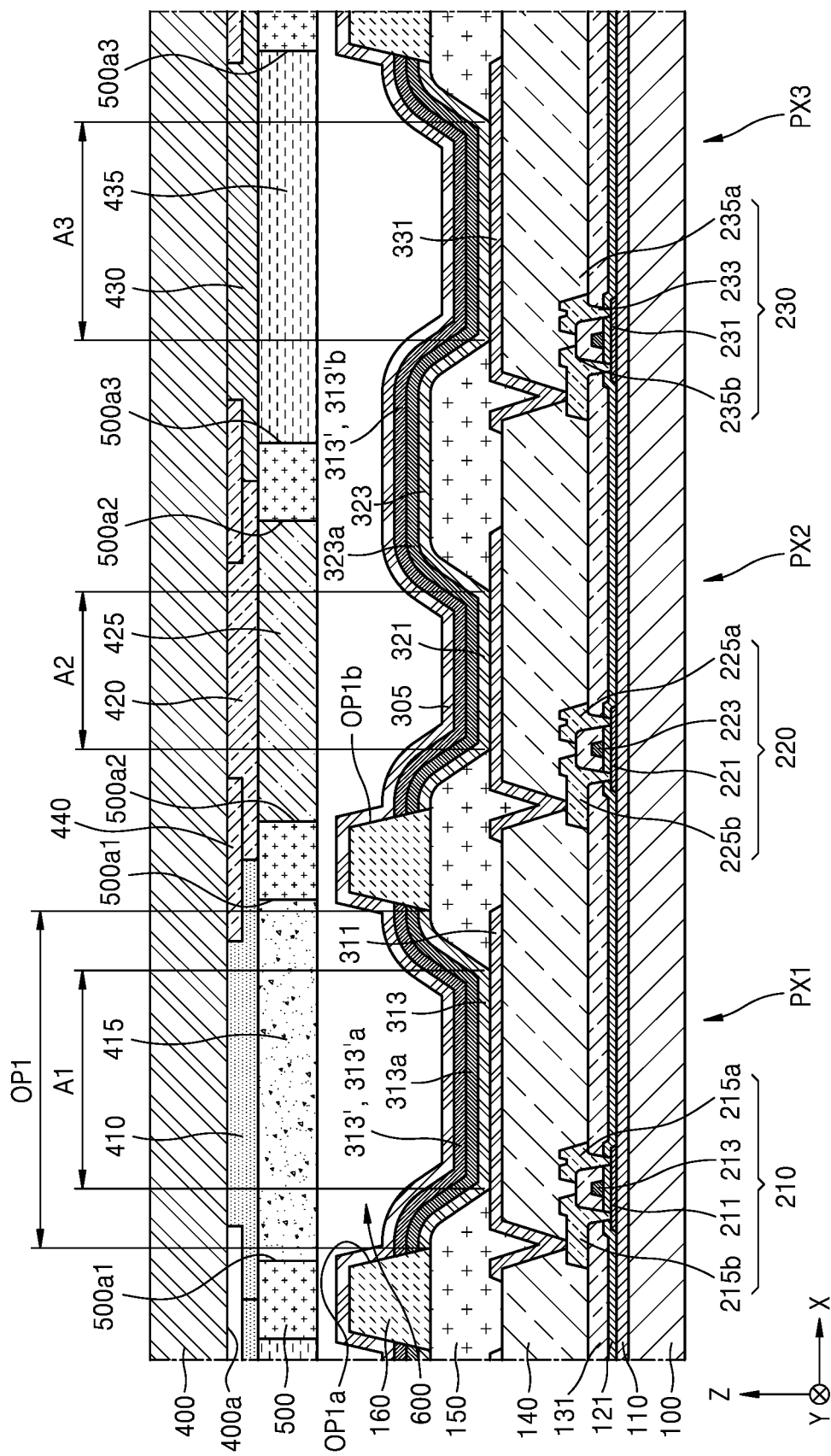
FIG. 8 is a cross-sectional view schematically illustrating a portion of a display apparatus according to another embodiment.

FIG. 8 is a cross-sectional view schematically illustrating a portion of a display apparatus according to another embodiment. The display apparatus according to an embodiment may be different from the display apparatus described above with reference to FIG. 7 in that the display apparatus may further include a first auxiliary emission layer 313a and a second auxiliary emission layer 323a.

The first auxiliary emission layer 313a may overlap the first pixel electrode 311 in view of the direction perpendicular to the lower substrate 100 (Z-axis-direction) and may emit light of a wavelength belonging to the first wavelength band, like the first emission layer 313. The second auxiliary emission layer 323a may overlap the second pixel electrode 321 and the third pixel electrode 331 in view of the direction perpendicular to the lower substrate 100 (Z-axis-direction) and may emit light of a wavelength belonging to the second wavelength band, like the second emission layer 323. Like the second emission layer 323 that may be apart from the first emission layer 313 by the bank 160, the second auxiliary emission layer 323a may also be apart from the first auxiliary emission layer 313a by the bank 160. For example, the description of the first emission layer 313 provided above may apply to the first auxiliary emission layer 313a, and the description of the second emission layer 323 provided above may apply to the second auxiliary emission layer 323a. The first auxiliary emission layer 313a and the first emission layer 313 may include a same material, and the second auxiliary emission layer 323a and the second emission layer 323 may include a same material.

The charge forming layer as described above may be between the first emission layer 313 and the first auxiliary emission layer 313a and between the second emission layer 323 and the second auxiliary emission layer 323a. Also, as illustrated in FIG. 8, the display apparatus may further include the additional emission layer 313' according to necessity. The second quantum dot layer 425 may be disposed on the lower surface 400a of the upper substrate 400 toward the lower substrate 100 (Z direction), and the second quantum dot layer 425 may overlap the second pixel electrode 321 in view of the direction perpendicular to the upper substrate 400 (Z-axis-direction) and may convert light passing through the second quantum dot layer 425 and having a wavelength belonging to the first wavelength band into light of a wavelength belonging to the second wavelength band.

In the first pixel PX1 in which the first pixel electrode 311 may be located, light of a wavelength that corresponds to the first wavelength band and may be emitted from the first emission layer 313, the first auxiliary emission layer 313a, and the additional emission layer 313' may be emitted to the outside. In the third pixel PX3 in which the third pixel electrode 331 may be located, the first quantum dot layer 435 may convert light of a wavelength that corresponds to the second wavelength band and may be emitted from the second emission layer 323 and the second auxiliary emission layer 323a, and light of a wavelength that corresponds to the first wavelength band and may be emitted from the additional emission layer 313', into light of a wavelength belonging to the third wavelength band, thereby emitting the light of the wavelength belonging to the third wavelength band to the outside. In the second pixel PX2 in which the second pixel electrode 321 may be located, light of a wavelength that corresponds to the second wavelength band and may be emitted from the second emission layer 323 and the second auxiliary emission layer 323a may be emitted to the outside without any change, and light of a wavelength that corresponds to the first wavelength band and may be emitted from the additional emission layer 313' may be converted by the second quantum dot layer 425 into light of a wavelength belonging to the second wavelength band and emitted to the outside.

The first auxiliary emission layer 313a may be between the first emission layer 313 and the additional emission layer 313', and the second auxiliary emission layer 323a may be between the second emission layer 323 and the additional emission layer 313'. The bank 160 may have a function of preventing mixture of a material for forming the first emission layer 313 or the first auxiliary emission layer 313a with a material for forming the second emission layer 323 or the second auxiliary emission layer 323a during a manufacturing process. In detail, the bank 160 prevents the material for forming the second emission layer 323 or the second auxiliary emission layer 323a from being located in the first pixel PX1. Thus, by forming the first emission layer 313, the first auxiliary emission layer 313a, the second emission layer 323, and the second auxiliary emission layer 323*a* before the additional emission layer 313' in the manufacturing process, the material for forming the second emission layer 323 or the second auxiliary emission layer 323*a* may be effectively prevented from reaching the first pixel PX1 or only a very limited portion of the material for forming the second emission layer 323 or the second auxiliary emission layer 323*a* may reach the first pixel PX1. In case that the additional emission layer 313' is first formed and the first emission layer 313 and the second emission layer 323 or the first auxiliary emission layer 313*a* and the second auxiliary emission layer 323*a* may be formed, a distance between a surface on which the second emission layer 323 or the second auxiliary emission layer 323*a* is to be formed and an end of the bank 160 toward the upper substrate 400 may be reduced, thus increasing a probability that the material for forming the second emission layer 323 or the second auxiliary emission layer 323*a* may be located in the first pixel PX1.

As illustrated in FIG. 8, the additional emission layer 313' may include a first portion 313'*a* overlapping the first pixel electrode 311 and a second portion 313'*b* overlapping the second pixel electrode 321 and the third pixel electrode 331, in view of the direction perpendicular to the upper substrate 400 (Z-axis-direction), and the first portion 313'*a* and the second portion 313'*b* may be apart from each other.

While the bank 160 is described above as a separate component from the pixel defining layer 150, the disclosure is not limited thereto. For example, the bank 160 and the pixel defining layer 150 may be integrally formed as a single body. A level of exposure may vary between a portion where the bank 160 is to be formed and a portion where the bank 160 is not to be formed by using a halftone mask, thereby integrally forming the bank 160 and the pixel defining layer 150 as a single body.

The bank 160 and the pixel defining layer 150 may be formed of different materials in different processes. According to necessity, the bank 160 may include a hydrophobic material, or a hydrophobic material may be disposed on a surface of the bank 160. For example, the bank 160 may include a fluorine. In case of forming the first emission layer 313, the second emission layer 323, the additional emission layer 313', the first auxiliary emission layer 313*a*, and/or the second auxiliary emission layer 323*a* by using an inkjet printing method, materials for forming the above emission layers may not be disposed on a surface of the bank 160 but in the first opening portion OP1 or the second opening portion OP2 of the bank 160.

Figure 4:
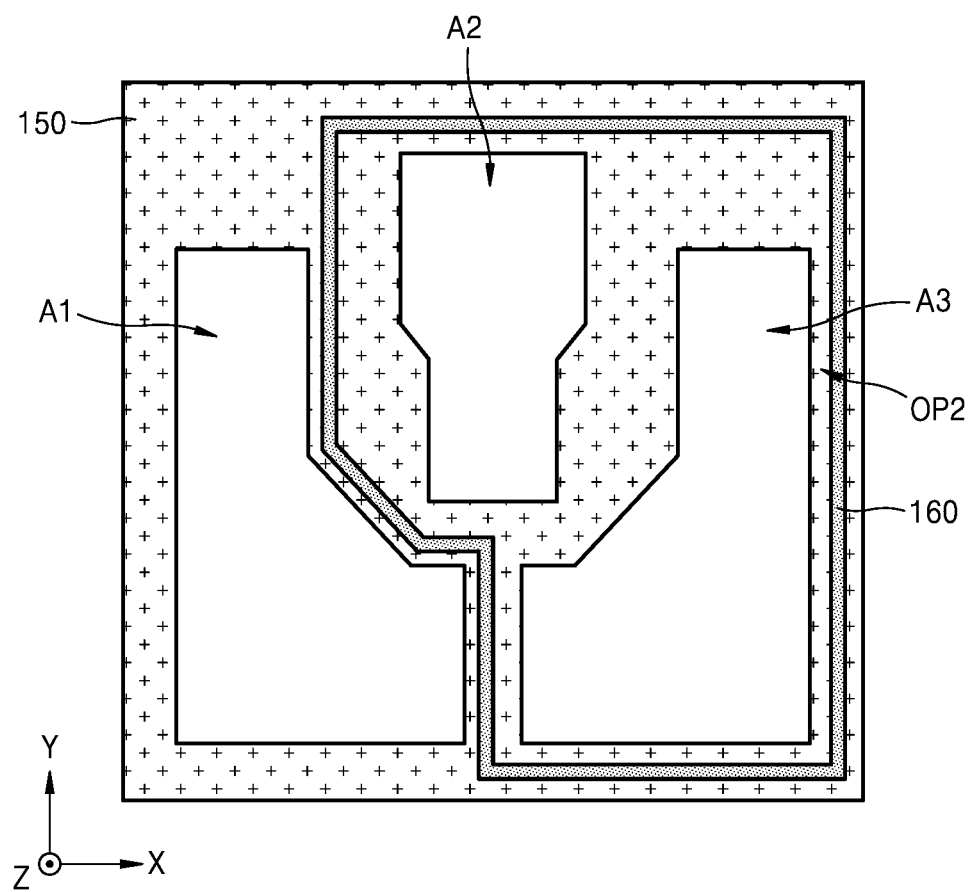
FIG. 4 is a plan view schematically illustrating a portion of the display apparatus of FIG. 3.
Figure 9:
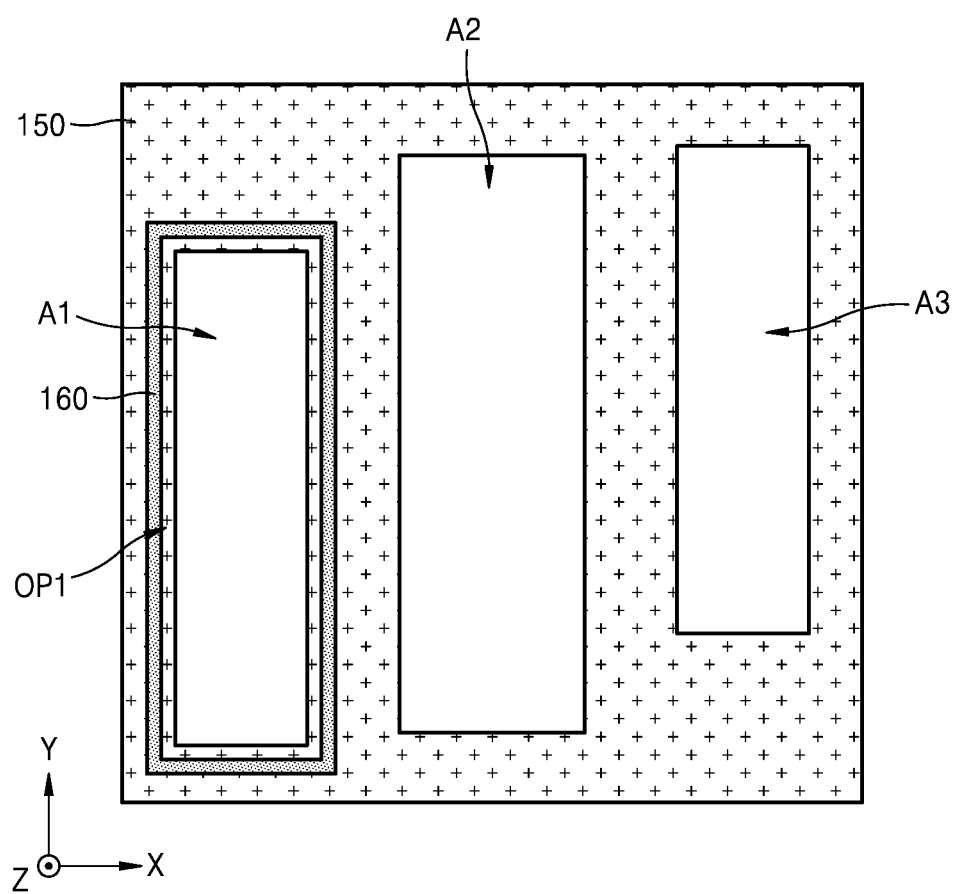
FIG. 9 is a plan view schematically illustrating a portion of a display apparatus according to another embodiment.
Figure 10:
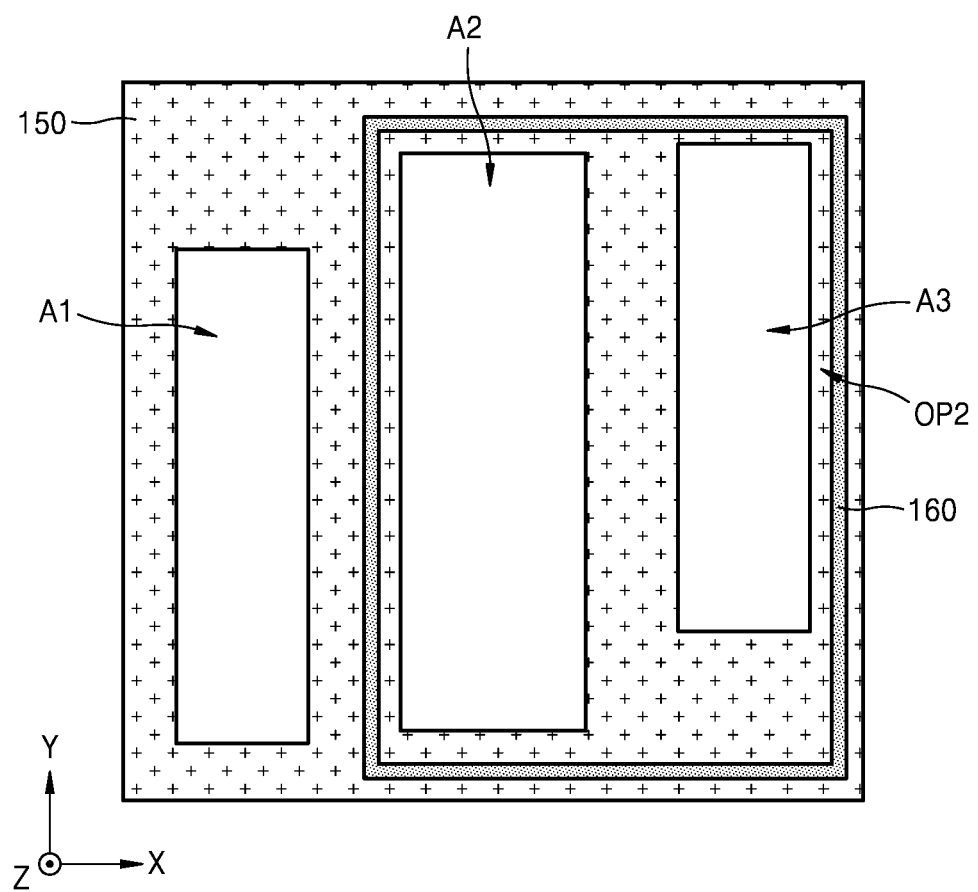
FIG. 10 is a plan view schematically illustrating a portion of a display apparatus according to another embodiment.
Figure 11:
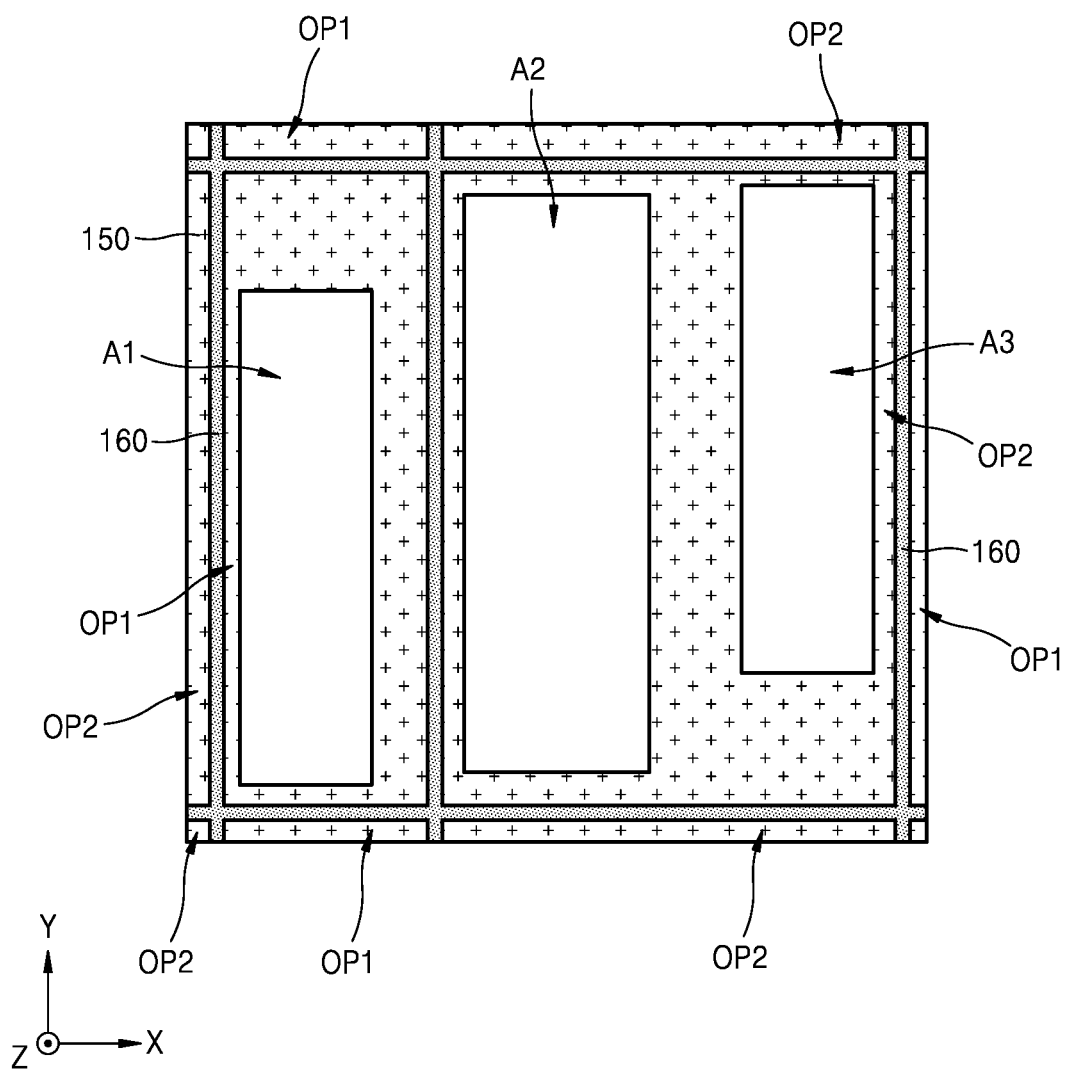
FIG. 11 is a plan view schematically illustrating a portion of a display apparatus according to another embodiment.

While the first opening A1, the second opening A2, and the third opening A3 having a non-rectangular shape are illustrated in FIGS. 2, 4, and 6, the disclosure is not limited thereto. For example, as illustrated in FIGS. 9 through 11 schematically illustrating a portion of a display apparatus according to other embodiments, the first opening A1, the second opening A2, and the third opening A3 may have a rectangular shape. The disclosure is not limited thereto, and the first opening A1, the second opening A2, and the third opening A3 may also have various shapes such as a circle, an oval, a square, or the like, in a plan view.

According to an embodiment as described above, a display apparatus having a high light efficiency may be implemented. However, the scope of the disclosure is not limited by the above-described effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a lower substrate;
a first pixel electrode, a second pixel electrode, and a third pixel electrode that are disposed apart from each other on the lower substrate;
a pixel defining layer overlapping an edge of each of the first pixel electrode, the second pixel electrode, and the third pixel electrode, the pixel defining layer comprising:
a first opening exposing a center portion of the first pixel electrode;
a second opening exposing a center portion of the second pixel electrode; and
a third opening exposing a center portion of the third pixel electrode;
a bank disposed on the pixel defining layer and isolating the first opening from the second opening and the third opening;
a first emission layer overlapping the first pixel electrode in view of a direction perpendicular to the lower substrate, the first emission layer emitting light of a wavelength belonging to a first wavelength band;
a second emission layer overlapping the second pixel electrode and the third pixel electrode in view of the direction perpendicular to the lower substrate, the second emission layer being disposed apart from the first emission layer, and emitting light of a wavelength belonging to a second wavelength band;
an upper substrate disposed on the lower substrate such that the first pixel electrode, the second pixel electrode, and the third pixel electrode are disposed between the upper substrate and the lower substrate; and
a first quantum dot layer disposed on a lower surface of the upper substrate toward the lower substrate, and overlapping the third pixel electrode in view of a direction perpendicular to the upper substrate, the first quantum dot layer converting light having a wavelength belonging to the second wavelength band into light of a wavelength belonging to a third wavelength band.

2. The display apparatus of claim 1, wherein the bank has a first opening portion such that the first opening is in the first opening portion in view of the direction perpendicular to the upper substrate.

3. The display apparatus of claim 2, wherein an edge of the first opening portion encircles the first opening in view of the direction perpendicular to the upper substrate.

4. The display apparatus of claim 2, wherein the first emission layer is disposed in the first opening portion.

5. The display apparatus of claim 4, wherein the first emission layer extends to an internal side surface of the first opening portion, and
the second emission layer extends to an external side surface of the bank.

6. The display apparatus of claim 1, wherein the bank has a second opening portion such that the second opening and the third opening are in the second opening portion in view of the direction perpendicular to the upper substrate.

7. The display apparatus of claim 6, wherein the second emission layer is disposed in the second opening portion.

8. The display apparatus of claim 7, wherein
the second emission layer extends to an internal side surface of the second opening portion, and
the first emission layer extends to an external side surface of the bank.

9. The display apparatus of claim 1, wherein
the bank has a first opening portion such that the first opening is in the first opening portion in view of the direction perpendicular to the upper substrate, and
the bank has a second opening portion such that the second opening and the third opening are in the second opening portion in view of the direction perpendicular to the upper substrate.

10. The display apparatus of claim 9, wherein
the first emission layer is in the first opening portion, and
the second emission layer is in the second opening portion.

11. The display apparatus of claim 10, wherein
the first emission layer extends to an internal side surface of the first opening portion, and
the second emission layer extends to an internal side surface of the second opening portion.

12. The display apparatus of claim 1, further comprising:
an additional emission layer overlapping the first pixel electrode, the second pixel electrode, and the third pixel electrode in view of the direction perpendicular to the upper substrate, the additional emission layer emitting light of a wavelength belonging to the first wavelength band; and
a second quantum dot layer disposed on the lower surface of the upper substrate toward the lower substrate, and overlapping the second pixel electrode in view of the direction perpendicular to the upper substrate, the second quantum dot layer converting light having a wavelength belonging to the first wavelength band into light of a wavelength belonging to the second wavelength band,
wherein the first quantum dot layer converts light having a wavelength belonging to the first wavelength band into light of a wavelength belonging to the third wavelength band.

13. The display apparatus of claim 12, wherein the additional emission layer is disposed between the first emission layer and the upper substrate and disposed between the second emission layer and the upper substrate.

14. The display apparatus of claim 12, wherein
the additional emission layer comprises:
a first portion overlapping the first pixel electrode in view of the direction perpendicular to the upper substrate; and
a second portion overlapping the second pixel electrode and the third pixel electrode, in view of the direction perpendicular to the upper substrate, and
the first portion and the second portion are apart from each other.

15. The display apparatus of claim 1, further comprising:
a first auxiliary emission layer overlapping the first pixel electrode in view of the direction perpendicular to the lower substrate, the first auxiliary emission layer emitting light of a wavelength belonging to the first wavelength band; and
a second auxiliary emission layer overlapping the second pixel electrode and the third pixel electrode in view of the direction perpendicular to the lower substrate, the second auxiliary emission layer being disposed apart from the first auxiliary emission layer, and emitting light of a wavelength belonging to the second wavelength band.

16. The display apparatus of claim 15, further comprising:
an additional emission layer overlapping the first pixel electrode, the second pixel electrode, and the third pixel electrode in view of the direction perpendicular to the upper substrate, the additional emission layer emitting light of a wavelength belonging to the first wavelength band; and
a second quantum dot layer disposed on the lower surface of the upper substrate toward the lower substrate, and overlapping the second pixel electrode in view of the direction perpendicular to the upper substrate, the second quantum dot layer converting light having a wavelength belonging to the first wavelength band, into light of a wavelength belonging to the second wavelength band,
wherein the first quantum dot layer converts light having a wavelength belonging to the first wavelength band into light of a wavelength belonging to the third wavelength band.

17. The display apparatus of claim 16, wherein
the first auxiliary emission layer is disposed between the first emission layer and the additional emission layer, and
the second auxiliary emission layer is disposed between the second emission layer and the additional emission layer.

18. The display apparatus of claim 1, further comprising:
a first color filter layer disposed on the lower surface of the upper substrate and overlapping the first pixel electrode in view of the direction perpendicular to the upper substrate, the first color filter layer transmitting light of a wavelength belonging to the first wavelength band;
a second color filter layer disposed on the lower surface of the upper substrate and overlapping the second pixel electrode in view of the direction perpendicular to the upper substrate, the second color filter layer transmitting light of a wavelength belonging to the second wavelength band; and
a third color filter layer disposed between the upper substrate and the first quantum dot layer, the third color filter layer transmitting light of a wavelength belonging to the third wavelength band.

19. The display apparatus of claim 1, wherein a wavelength of light emitted from the second emission layer is greater than a wavelength of light emitted from the first emission layer.

* * * * *